(12) United States Patent
Oster et al.

(10) Patent No.: US 10,732,501 B2
(45) Date of Patent: *Aug. 4, 2020

(54) METHOD AND DEVICE FOR PERMANENTLY REPAIRING DEFECTS OF ABSENT MATERIAL OF A PHOTOLITHOGRAPHIC MASK

(71) Applicant: Carl Zeiss SMT GmbH, Oberkochen (DE)

(72) Inventors: Jens Oster, Ober-Ramstadt (DE); Kinga Kornilov, Rossdorf (DE); Tristan Bret, Rixheim (FR); Horst Schneider, Wiesbaden (DE); Thorsten Hofmann, Rodgau (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/452,632

(22) Filed: Jun. 26, 2019

(65) Prior Publication Data

US 2019/0317395 A1 Oct. 17, 2019

Related U.S. Application Data

(63) Continuation of application No. 15/441,678, filed on Feb. 24, 2017, now Pat. No. 10,372,032.

(30) Foreign Application Priority Data

Feb. 26, 2016 (DE) ........................ 10 2016 203 094

(51) Int. Cl.
*G03F 1/72* (2012.01)
*G03F 1/74* (2012.01)
(Continued)

(52) U.S. Cl.
CPC .............. *G03F 1/72* (2013.01); *C23C 14/048* (2013.01); *C23C 14/083* (2013.01);
(Continued)

(58) Field of Classification Search
None
See application file for complete search history.

(56) References Cited

U.S. PATENT DOCUMENTS 5,083,033 A 1/1992 Komano et al.
5,104,684 A 4/1992 Tao et al.
(Continued)

FOREIGN PATENT DOCUMENTS

DE 102013203995 9/2014 ........... H01L 21/027
DE 102015103260 8/2016 ........... H01L 21/033
(Continued)

OTHER PUBLICATIONS

Sousa et al., "Cr2O3 thin films grown at room temperature by low pressure laser chemical vapor deposition" Thin Sol. Films, vol. 5193653-3657 (2011).*

(Continued)

*Primary Examiner* — Martin J Angebranndt
(74) *Attorney, Agent, or Firm* — Fish & Richardson P.C.

(57) ABSTRACT

The present application relates to a method for permanently repairing defects of absent material of a photolithographic mask, comprising the following steps: (a) providing at least one carbon-containing precursor gas and at least one oxidizing agent at a location to be repaired of the photolithographic mask; (b) initiating a reaction of the at least one carbon-containing precursor gas with the aid of at least one energy source at the location of absent material in order to deposit material at the location of absent material, wherein the deposited material comprises at least one reaction product of the reacted at least one carbon-containing precursor (Continued)

gas; and (c) controlling a gas volumetric flow rate of the at least one oxidizing agent in order to minimize a carbon proportion of the deposited material.

24 Claims, 9 Drawing Sheets

(51) Int. Cl.
| | |
|---|---|
| *H01J 37/30* | (2006.01) |
| *H01J 37/317* | (2006.01) |
| *C23C 14/04* | (2006.01) |
| *C23C 14/08* | (2006.01) |
| *C23C 14/10* | (2006.01) |
| *C23C 14/22* | (2006.01) |
| *C23C 14/54* | (2006.01) |
| *C23C 14/58* | (2006.01) |
| *C23C 14/28* | (2006.01) |
| *C23C 14/30* | (2006.01) |
| *C23C 16/16* | (2006.01) |
| *C23C 16/18* | (2006.01) |
| *C23C 16/04* | (2006.01) |
| *C23C 16/40* | (2006.01) |
| *C23C 16/56* | (2006.01) |
| *C23C 16/48* | (2006.01) |
| *G03F 1/26* | (2012.01) |

(52) U.S. Cl.
CPC ............ *C23C 14/085* (2013.01); *C23C 14/10* (2013.01); *C23C 14/221* (2013.01); *C23C 14/28* (2013.01); *C23C 14/30* (2013.01); *C23C 14/548* (2013.01); *C23C 14/5873* (2013.01); *C23C 16/047* (2013.01); *C23C 16/16* (2013.01); *C23C 16/18* (2013.01); *C23C 16/402* (2013.01); *C23C 16/405* (2013.01); *C23C 16/483* (2013.01); *C23C 16/486* (2013.01); *C23C 16/56* (2013.01); *G03F 1/26* (2013.01); *G03F 1/74* (2013.01); *H01J 37/30* (2013.01); *H01J 37/3178* (2013.01); *H01J 2237/006* (2013.01); *H01J 2237/30466* (2013.01); *H01J 2237/31744* (2013.01)

(56) References Cited

U.S. PATENT DOCUMENTS

| | | | |
|---|---|---|---|
| 5,429,730 A | 7/1995 | Nakamura et al. | |
| 5,807,650 A | 9/1998 | Komano et al. | |
| 6,891,171 B1 | 5/2005 | Hagiwara et al. | |
| 7,727,682 B2 | 6/2010 | Pan et al. | |
| 10,372,032 B2* | 8/2019 | Oster | C23C 16/483 |
| 2004/0151991 A1 | 8/2004 | Stewart et al. | |
| 2005/0276932 A1 | 12/2005 | Takaoka et al. | |
| 2006/0223300 A1* | 10/2006 | Simka | C23C 16/18 |
| | | | 438/618 |
| 2008/0233486 A1 | 9/2008 | Pan et al. | |
| 2008/0314871 A1 | 12/2008 | Toth et al. | |
| 2010/0092876 A1 | 4/2010 | Kanamitsu | |
| 2011/0079711 A1 | 4/2011 | Buehler et al. | |
| 2011/0086296 A1 | 4/2011 | Moon et al. | |
| 2012/0034552 A1* | 2/2012 | Okubo | G03F 1/48 |
| | | | 430/5 |
| 2012/0261563 A1 | 10/2012 | Lai et al. | |
| 2012/0273458 A1 | 11/2012 | Bret et al. | |
| 2013/0107248 A1 | 5/2013 | Wu et al. | |
| 2014/0165236 A1 | 6/2014 | Budach et al. | |
| 2014/0255831 A1 | 9/2014 | Hofmann et al. | |
| 2015/0261085 A1 | 9/2015 | Chu | |
| 2016/0054650 A1* | 2/2016 | Nam | G03F 1/26 |
| | | | 430/5 |
| 2016/0181094 A1 | 6/2016 | Yu et al. | |
| 2016/0195803 A1* | 7/2016 | Adachi | G03F 1/32 |
| | | | 430/5 |
| 2016/0238928 A1 | 8/2016 | Huang et al. | |
| 2016/0258053 A1 | 9/2016 | Pickens | |
| 2017/0139321 A1 | 5/2017 | Tsai et al. | |
| 2017/0140927 A1 | 5/2017 | Shih et al. | |
| 2017/0248842 A1 | 8/2017 | Oster et al. | |

FOREIGN PATENT DOCUMENTS

| | | | | |
|---|---|---|---|---|
| JP | H06-347997 | 12/1994 | ............... | G03F 1/08 |
| JP | 2005-539273 | 12/2005 | ............... | G03F 1/08 |
| JP | 2012-230148 | 11/2012 | ............... | G03F 1/72 |
| KR | 1020140110747 | 9/2014 | ........... | H01L 21/027 |
| TW | 480660 | 3/2002 | ........... | H01L 21/768 |
| TW | 201308391 | 2/2013 | ............ | H01J 37/304 |
| TW | 201438060 | 10/2014 | ........... | H01L 21/027 |
| WO | WO 2005/017949 | 2/2005 | | |
| WO | WO 2012/146647 | 11/2012 | ........... | H01L 37/304 |

OTHER PUBLICATIONS

Van Dorp, et al., "Growth behavior near the ultimate resolution of nanometer-scal focused electron beam-induced deposition", Nanotech., vol. 19 225305 (9 pp) (2008).*
Notice of Examination from the Taiwan Patent Office for Taiwanese Application No. 106105551 dated Jul. 4, 2018.
Korean Office Action for Korean Application No. 10-2017-0024826 dated Nov. 28, 2018.
Office Action and Search Report from the Taiwan Patent Office for Taiwan Patent Application No. 106105551 dated Jul. 28, 2017.
Taiwan Office Action for Taiwanese Patent Application No. 106105551 dated Nov. 21, 2018.
Chinese Office Action for Chinese Application No. 201710106325.1 dated Feb. 3, 2020 (with English Translation).

* cited by examiner

METHOD AND DEVICE FOR PERMANENTLY REPAIRING DEFECTS OF ABSENT MATERIAL OF A PHOTOLITHOGRAPHIC MASK

CROSS REFERENCE TO RELATED APPLICATIONS

This application is a continuation of and claims priority under 35 U.S.C. § 120 from U.S. application Ser. No. 15/441,678, filed on Feb. 24, 2017, now U.S. Pat. No. 10,372,032, which claims priority to German patent application 10 2016 203 094.9, filed on Feb. 26, 2016. The entire contents of each of these priority applications are hereby incorporated by reference.

TECHNICAL FIELD

The present invention relates to a method and a device for permanently repairing defects of absent material of a photolithographic mask.

BACKGROUND

As a consequence of the constantly increasing integration density in microelectronics, photolithographic masks have to image structure elements that are becoming ever smaller into a photoresist layer of a wafer. In order to meet these requirements, the exposure wavelength is being shifted to ever shorter wavelengths. At the present time, argon fluoride (ArF) excimer lasers are principally used for exposure purposes, these lasers emitting at a wavelength of 193 nm. Intensive work is being done in regard to light sources which emit in the extreme ultraviolet (EUV) wavelength range (10 nm to 15 nm), and corresponding EUV masks. In order to increase the resolution capability of wafer exposure processes, a number of variants of the conventional binary photolithographic masks have been developed simultaneously. Examples thereof are phase masks or phase shifting masks and masks for multiple exposure.

On account of the ever decreasing dimensions of the structure elements, photolithographic masks, photomasks or simply masks cannot always be produced without defects that are printable or visible on a wafer. Owing to the costly production of photomasks, defective photomasks, whenever possible, are repaired. Two important groups of defects of photolithographic masks are, firstly, dark defects. These are locations at which absorber or phase shifting material is present, but which should be free of this material. These defects are repaired by removing the excess material preferably with the aid of a local etching process.

Secondly, there are so-called clear defects. These are defects on the photomask which, upon optical exposure in a wafer stepper or wafer scanner, have a greater light transmissivity than an identical defect-free reference position. In mask repair processes, these defects can be eliminated by depositing a material having suitable optical properties. Ideally, the optical properties of the material used for the repair should correspond to those of the absorber or phase shifting material. The layer thickness of the repaired location can then be adapted to the dimensions of the layer of the surrounding absorber or phase shifting material.

The material deposited for the repair should satisfy at least two further requirements. Firstly, it should withstand a predefined number of mask cleaning cycles substantially without alterations to its constitution, i.e. the optical properties and size. Secondly, a given number of wafer exposures should be able to be carried out with the deposited material, without the stated properties of the deposited material experiencing a significant change with regard to the adjacent absorber or phase shifting material.

WO 2012/146647 A1 describes the deposition of a reference marking on a photomask with the aid of a particle beam, a process gas and an additional gas, which may be an oxidizing gas.

WO 2005/017949 A2 describes the deposition of material on a photomask by use of an electron beam and TEOS (tetraethyl orthosilicate) or an organic or inorganic precursor gas.

The US patent having the number U.S. Pat. No. 7,727,682 B2 describes the repair of a phase shifting layer with the aid of an electron beam and the deposition gas TEOS. In order to protect the repaired location, in a second process step, a chromium protective layer is deposited on the phase shifting photomask over the whole area with the aid once again of an electron beam and of chromium hexacarbonyl.

The applicant has established that repaired locations of clear defects may be subject to a change in the course of the use of repaired photomasks. The document cited last reveals that a location repaired by the deposition of a suitable material has to be provided with a protective layer.

However, applying a whole-area protective layer on a repaired mask in order to cover one or more repaired locations is a time- and cost-intensive additional process step. Moreover, depositing this additional layer entails the risk that a layer that is not perfectly uniform will produce a new defect of the repaired photomask.

The present invention therefore addresses the problem of specifying a method and a device which enable a permanent repair of defects of absent material of a photolithographic mask and avoid at least some of the disadvantages discussed above.

SUMMARY

According to an exemplary embodiment of the present invention, this problem is solved by a method for permanently repairing defects of absent material of a photolithographic mask, the method comprising the following steps: (a) providing at least one carbon-containing precursor gas and at least one oxidizing agent at a location to be repaired of the photolithographic mask; (b) initiating a reaction of the at least one carbon-containing precursor gas with the aid of at least one energy source at the location of absent material in order to deposit material at the location of absent material, wherein the deposited material comprises at least one reaction product of the reacted at least one carbon-containing precursor gas; and (c) controlling a gas volumetric flow rate of the at least one oxidizing agent in order to minimize a carbon proportion of the deposited material.

When depositing material from a carbon-containing precursor gas, in methods and devices according to the prior art part of the carbon contained in the precursor gas, or of one or more carbon compounds, may be inadvertently incorporated into the deposited material. During the exposure of a photomask having one or a plurality of correspondingly repaired locations of clear defects, the deep ultraviolet (DUV) radiation used for the exposure and/or the ozone arising from the ambient gas during the exposure process, extract part of the carbon incorporated into the deposited material. Furthermore, a repeated process of cleaning the repaired mask can likewise liberate part of the carbon present in the deposited material. Both processes alter the properties, in particular the optical properties, and/or the structure of the material deposited in the mask repair process.

A method according to the invention solves this problem by controlled oxidation of the precursor gas during the chemical reaction of the precursor gas initiated by an energy source. The proportion of volatile carbon-containing compounds that can leave the reaction site is significantly increased as a result. As a consequence thereof, the fraction of carbon incorporated into the deposited material is significantly reduced. As a result of the reduced carbon proportion, the material deposited for repairing a clear defect has a significantly increased long-term stability. It can withstand a predefined number of exposure and cleaning cycles substantially without a change in its optical properties and its dimensions.

In this application, a reaction or a chemical reaction denotes a process in which one or more chemical compounds are converted into one or more other compounds. In the context of this application, a dissociation of a chemical compound is regarded as a special case of a reaction or of a chemical reaction.

The expression "substantially" here, as at these places in this description, denotes an indication of a measured variable within the customary error limits when using metrology according to the prior art.

According to a further aspect, the deposited material comprises a carbon proportion of <20 atom %, preferably <15 atom %, more preferably <10 atom %, and most preferably <5 atom %.

During the deposition of a layer composed of a carbon-containing precursor gas, the carbon proportion in the deposited material is in the region of 20 atom % or higher. By additionally providing an oxidizing agent during the chemical reaction of the carbon-containing material, it is possible for a carbon proportion of the deposited material to be significantly reduced. As a consequence thereof, the ageing process of the deposited material is drastically slowed down.

According to another aspect, the at least one carbon-containing precursor gas comprises at least one metal carbonyl and/or at least one main group element alkoxide.

Metal carbonyls can be used to correct clear defects of binary photomasks. A precursor gas in the form of a main group element alkoxide can be used for repairing substrate defects of a transmissive photomask and/or for repairing EUV masks. A carbon-containing precursor gas which comprises a metal carbonyl and a main group alkoxide can be used for correcting clear defects present on phase masks.

According to yet another aspect, the at least one metal carbonyl comprises at least one element from the group: chromium hexacarbonyl ($Cr(CO)_6$), molybdenum hexacarbonyl ($Mo(CO)_6$), tungsten hexacarbonyl ($W(CO)_6$), dicobalt octacarbonyl ($Co_2(CO)_8$), triruthenium dodecacarbonyl ($Ru_3(CO)_{12}$), and iron pentacarbonyl ($Fe(CO)_5$).

In accordance with yet another aspect, the at least one main group element alkoxide comprises at least one element from the group: tetraethyl orthosilicate ($Si(OC_2H_5)_4$, TEOS), tetramethyl orthosilicate ($Si(OCH_3)_4$, TMOS) and titanium tetraisopropoxide ($Ti(OCH(CH_3)_2)_4$).

According to one expedient aspect, the at least one oxidizing agent comprises at least one element from the group: oxygen ($O_2$), ozone ($O_3$), water vapor ($H_2O$), hydrogen peroxide ($H_2O_2$), dinitrogen monoxide ($N_2O$), nitrogen monoxide (NO), nitrogen dioxide ($NO_2$) and nitric acid ($HNO_3$).

An oxidizing agent can be used independently of whether the carbon-containing precursor gas comprises a metal carbonyl, a main group element alkoxide or a combination of a metal carbonyl and a main group element alkoxide.

According to yet another aspect, the at least one energy source comprises at least one particle beam. In accordance with yet another expedient aspect, the at least one particle beam comprises an electron beam and/or a photon beam.

Both electron beams and photon beams can be finely focused, such that the area within which an electron beam and/or a photon beam initiate(s) a chemical reaction of the at least one carbon-containing precursor gas is very small. The spatial resolution when repairing local clear defects is thus high.

The electron beam can have a resolution in a range of 0.4 nm to 10 nm, preferably 0.5 nm to 8 nm, more preferably 0.6 nm to 6 nm, and most preferably of 0.7 nm to 4 nm. Furthermore, the electron beam can have an energy in a range of 0.05 keV to 5 keV, preferably 0.1 keV to 4 keV, more preferably 0.2 keV to 3 keV, and most preferably 0.4 keV to 2 keV. Furthermore, the electron beam can have a beam current in a range of 5 pA to 100 pA, preferably 10 pA to 80 pA, more preferably 15 pA to 70 pA, and most preferably of 20 pA to 60 pA.

In a further aspect, the electron beam at a location to be repaired has a dwell time in the range of 30 ns to 1 s, preferably 50 ns to 100 ms, more preferably 50 ns to 10 μs, and most preferably of 50 ns to 5 μs. In accordance with another expedient aspect, the electron beam has a repetition time in the range of 1 us to 10 s, preferably 10 μs to 1 s, more preferably 50 us to 300 ms, and most preferably 100 us to 100 ms.

The absent material can comprise at least one element from the group: absent material of at least one structure element of a binary mask, absent material of at least one structure element of a phase mask, absent material of at least one structure element of a photomask for the extreme ultraviolet wavelength range, absent material of a substrate of a transmissive photolithographic mask, and/or absent material of a nanoimprint technology mask.

The method according to the invention can advantageously be used for correcting clear defects of the various photomasks currently used and in development.

Providing the at least one carbon-containing precursor gas and the at least one oxidizing agent at the location of absent material can be carried out with a mixture ratio of 1:100, preferably 1:50, more preferably 1:25, and most preferably 1:10.

It is expedient to provide at least ten times more particles of an oxidizing agent at a location to be repaired of a photomask than particles of a precursor gas. The oxidizing agent that provides oxygen ensures that a highest possible proportion of volatile carbon-containing compounds is formed during the chemical reaction of the precursor gas.

Providing the at least one metal carbonyl and the at least one main group element alkoxide can be carried out with a mixture ratio of 1:20, preferably 1:10, more preferably 1:7, and most preferably 1:5.

As a result of the oxidation of the precursor materials, during the deposition process for repairing a clear defect of a phase mask, the carbon proportion in the deposited material is reduced in comparison with deposited materials from the prior art. A sufficient stability against carbon-reactive mask cleaning processes can thus be achieved. For the same reason, it is possible to achieve a sufficient durability in relation to the exposure of the repaired mask in a wafer stepper or wafer scanner. For this purpose, in the case of the repair of phase shifting masks—with the action of a corresponding oxidizing agent—a small admixture of metal carbonyls to a precursor gas composed of a main group element alkoxide is already sufficient.

In accordance with one advantageous aspect, providing the at least one main group element alkoxide and the at least one oxidizing agent at the location of absent material is carried out with a mixture ratio of 1:100, preferably 1:50, more preferably 1:25, and most preferably 1:10.

In a manner similar to that for the ratio of metal carbonyl to oxidizing agent, it is advantageous to provide significantly more particles of an oxidizing agent at a location to be repaired of a photomask than particles of a precursor gas composed of a main group element alkoxide.

In one advantageous aspect, providing the at least one oxidizing agent is carried out with a gas volumetric flow rate in the range of 0.3 sccm to 10 sccm, preferably 0.5 sccm to 7 sccm, more preferably 1 sccm to 5 sccm, and most preferably 2 sccm to 4 sccm.

The gas volumetric flow rate of the oxidizing agent can be set with the aid of a metering valve and/or by a change in temperature of the stored oxidizing agent. The metering valve can be realized in the form of a mass flow controller.

According to one preferred aspect, providing the at least one metal carbonyl at the location of absent material is carried out in a pressure range of $10^{-6}$ mbar to $10^{-4}$ mbar, providing the at least one main group alkoxide is carried out in a pressure range of $10^{-6}$ mbar to $10^{-4}$ mbar, and/or providing the at least one oxidizing agent is carried out in a pressure range of $10^{-5}$ mbar to $10^{-2}$ mbar.

In accordance with yet another aspect, providing the at least one metal carbonyl at the location of absent material is carried out in a temperature range of $-50°$ C. to $+35°$ C., preferably $-40°$ C. to $+30°$ C., more preferably $-30°$ C. to $+25°$ C., and most preferably $-20°$ C. to $+20°$ C. It is advantageous to adapt the temperature range for providing the at least one metal carbonyl to the metal carbonyl(s) used.

Providing the at least one main group element alkoxide at the location of absent material can be carried out in a temperature range of $-40°$ C. to $+15°$ C., preferably $-30°$ C. to $+5°$ C., more preferably $-20°$ C. to $-5°$ C., and most preferably $-15°$ C. to $-10°$ C.

Material can be deposited at a rate of 0.01 nm/s to 1.0 nm/s, preferably 0.02 nm/s to 0.5 nm/s, more preferably 0.04 nm/s to 0.3 nm/s, and most preferably 0.05 nm/s to 0.15 nm/s.

The photolithographic mask can comprise a phase mask, and providing the at least one precursor gas can comprise simultaneously providing chromium hexacarbonyl ($Cr(CO)_6$) and tetraethyl orthosilicate ($Si(OC_2H_5)_4$, TEOS).

A precursor gas comprising chromium hexacarbonyl and TEOS can be used for correcting a clear defect of a phase mask, in particular an attenuated phase shift mask. In association with a deposition step, a defect repair largely exhibiting long-term stability can be achieved with this precursor gas combination. The deposition of a protective layer over the repaired and thus simultaneously over the entire photomask is no longer necessary.

According to yet another aspect, a device for permanently repairing defects of absent material of a photolithographic mask comprises: (a) means for providing at least one carbon-containing precursor gas and at least one oxidizing agent at a location to be repaired of the photolithographic mask; (b) at least one energy source for initiating a reaction of the at least one carbon-containing precursor gas at the location of absent material in order to deposit material at the location of absent material, wherein the deposited material comprises at least one reaction product of the reacted at least one carbon-containing precursor gas; and (c) means for controlling a gas volumetric flow rate of the at least one oxidizing agent in order to minimize a carbon proportion of the deposited material.

A device according to the invention enables the local deposition of material exhibiting long-term stability on a photomask, which material substantially reproduces the optical properties of the material surrounding the defect. The deposited material can thus be adapted to the dimensions of the defect.

According to a further aspect, the means for providing the at least one carbon-containing precursor gas and the at least one oxidizing agent comprises at least three supply containers each having at least one metering valve and at least one gas feed line system having at least one nozzle near the location to be repaired, in order to provide at least one first and one second carbon-containing precursor gas and at least one oxidizing agent.

Finally, the means for controlling the gas volumetric flow rate of the at least one oxidizing agent can comprise a control unit configured to control the gas volumetric flow rate of the at least one carbon-containing precursor gas and of the at least one oxidizing agent.

DESCRIPTION OF DRAWINGS

The following detailed description describes currently preferred exemplary embodiments of the invention, with reference being made to the drawings, in which.

DETAILED DESCRIPTION

Currently preferred embodiments of the device according to the invention for permanently repairing defects of absent material of a photolithographic mask are explained in greater detail below on the basis of the example of a modified scanning electron microscope. However, the device according to the invention is not restricted to the example described below. As will be recognized without difficulty by a person skilled in the art, instead of the scanning electron microscope discussed it is possible to employ any scanning particle microscope which uses for example a focused ion beam and/or a focused photon beam as energy source. Furthermore, the method according to the invention is not restricted to the use of the photomasks discussed by way of example below. Rather, this method can be used for repairing any desired photolithographic masks.

Furthermore, the application of the method according to the invention is not restricted to the application to photomasks. Rather, this method can be employed for repairing templates for nanoimprint technology or generally for correcting optical elements having defects of absent material.

Figure 1:
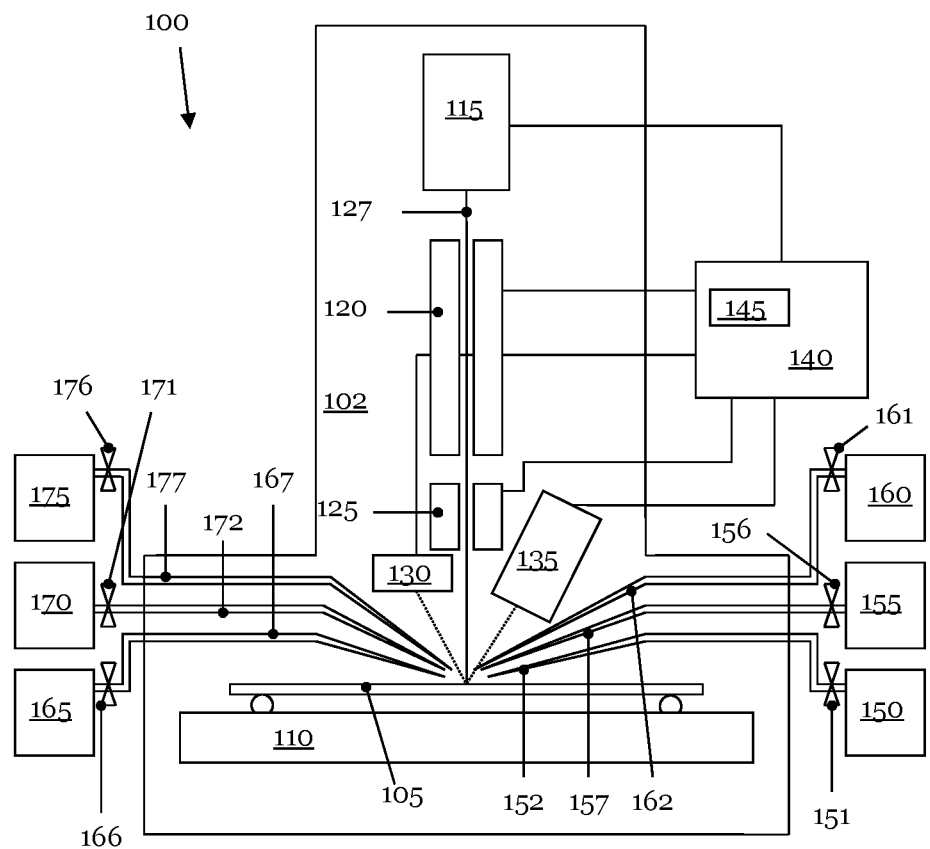
FIG. 1 schematically illustrates a block diagram of some important components of a device which can be used for repairing clear defects of a photomask.

FIG. 1 schematically shows essential components of a device 100 which can be used for permanently repairing samples 105 having defects of absent material. Here, the phrase "permanently repairing samples 105 having defects of absent material" means that the material deposited for repairing the defects has a significantly increased long-term stability, and that it can withstand a predefined exposure dose and a predefined number of cleaning cycles (e.g. at least 10) substantially without a change in its optical properties and its dimensions.

The sample 105 may be an arbitrary microstructured component or structural part. By way of example, the sample 105 may comprise a transmissive or a reflective photomask and/or a template for nanoimprint technology. Furthermore, the device 100 can be used for repairing for example an integrated circuit, a microelectromechanical system (MEMS) and/or a photonic integrated circuit which have/has defects of absent material. In the examples explained below, the sample 105 is a photolithographic mask 105.

The exemplary device 100 in FIG. 1 is a modified scanning electron microscope (SEM). An electron gun 115 generates an electron beam 127, which is directed by the elements 120 and 125 as a focused electron beam 127 onto the photolithographic mask 105 arranged on a sample stage 110.

The sample stage 110 has micromanipulators (not shown in FIG. 1) with the aid of which the defective location of the photomask 105 can be brought beneath the point of incidence of the electron beam 127 on the photomask 105. In addition, the sample stage 110 can be displaced in height, i.e. in the beam direction of the electron beam 127, such that the focus of the electron beam 127 becomes located on the surface of the photomask 105 (likewise not illustrated in FIG. 1). Furthermore, the sample stage 110 can comprise a device for setting and controlling the temperature, which makes it possible to bring the photomask 105 to a predefined temperature and to keep it at this temperature (not indicated in FIG. 1).

The device 100 in FIG. 1 uses an electron beam 127 as energy source 127 for initiating a local chemical reaction of a carbon-containing precursor gas. An electron beam 127 can be focused onto a small focal spot having a diameter of <10 nm. In addition, electrons that are incident on the surface of the photomask 105 cause hardly any damage to the photomask 105, even if their kinetic energy varies over a large energy range. However, the device 100 and the method presented here are not restricted to the use of an electron beam 127. Rather, any desired particle beam can be used which is able to bring about locally a chemical reaction of a precursor gas at the point of incidence of the particle beam on the surface of the photomask 105. Examples of alternative particle beams are an ion beam, atomic beam, molecular beam and/or photon beam. Furthermore, it is possible to use two or more particle beams in parallel. In particular, it is possible simultaneously to use an electron beam 127 and a photon beam as energy source 127 (not shown in FIG. 1).

The electron beam 127 can be used for recording an image of the photomask 105, in particular of a defective location of the photomask 105. A detector 130 for detecting backscattered electrons and/or secondary electrons supplies a signal that is proportional to the surface contour and/or composition of the photomask 105.

By scanning or raster-scanning the electron beam 127 over the photomask 105 with the aid of a control unit 145, a computer system 140 of the device 100 can generate an image of the photomask 105. The control unit 145 can be part of the computer system 140, as illustrated in FIG. 1, or can be embodied as a separate unit (not illustrated in FIG. 1). The computer system 140 can comprise algorithms which are realized in hardware, software, firmware or a combination thereof and which make it possible to extract an image from the measurement data of the detector 130. A screen of the computer system 140 (not shown in FIG. 1) can represent the calculated image. Furthermore, the computer system 140 can store the measurement data of the detector 130 and/or the calculated image. Furthermore, the control unit 145 of the computer system 140 can control the electron gun 115 and the beam-imaging and beam-shaping elements 120 and 125. Control signals of the control unit 145 can furthermore control the movement of the sample stage 110 by use of micromanipulators (not indicated in FIG. 1).

The electron beam 127 incident on the photomask 105 can electrostatically charge the photomask 105. As a result, the electron beam 127 can be deflected and the spatial resolution when recording a defect and when repairing the latter can be reduced. In order to reduce an electrostatic charging of the photomask 105, an ion gun 135 can be used to irradiate the surface of the photomask 105 with ions having low kinetic energy. By way of example, it is possible to use argon ions having a kinetic energy of a few 100 eV for neutralizing the photomask 105.

In order to process the photomask 105 arranged on the sample stage 110, i.e. to repair the defects of said photomask, the device 100 comprises at least three supply containers for three different processing gases. The first supply container 150 stores a first precursor gas, in particular a first carbon-containing precursor gas. By way of example, a main group element alkoxide can be stored in the first supply container, such as TEOS, for instance. The second supply container 155 stores a second carbon-containing precursor gas. The precursor gas stored in the second supply container 155 may be for example a metal carbonyl, for instance chromium hexacarbonyl. The third supply container 160 stores an oxidizing agent, for instance oxygen. An oxidizing agent can comprise for example an element from the group: oxygen ($O_2$), ozone ($O_3$), water vapor ($H_2O$), hydrogen peroxide ($H_2O_2$), dinitrogen monoxide ($N_2O$), nitrogen monoxide (NO), nitrogen dioxide ($NO_2$), nitric acid ($HNO_3$) and other oxygen-containing compounds.

The fourth, optional supply container 165 can store for example a second oxidizing agent, such as $NO_2$, for instance. The fifth, likewise optional supply container 170 can store a further precursor gas, for example a second metal carbonyl or a second main group element alkoxide. Finally, the sixth, optional supply container 175 can contain an etching gas. With the aid thereof, defects of excess material (dark defects) of the photomask 105 can be repaired. Furthermore, the etching gas stored in the sixth container 175 can be used to remove again too much material deposited on the mask 105 during a defect repair.

Each supply container 150, 155, 160, 165, 170, 175 has its own control valve 151, 156, 161, 166, 171, 176, in order to supervise or control the absolute value of the corresponding gas that is provided per unit time, i.e. the gas volumetric flow rate at the location of the incidence of the electron beam 127. The control valves 151, 156, 161, 166, 171 and 176 are controlled and supervised by the control unit 145 of the computer system 140. The partial pressure ratios of the gases provided at the processing site can thus be set in a wide range.

Furthermore, in the exemplary device 100 each supply container 150, 155, 160, 165, 170, 175 has its own gas feed line system 152, 157, 162, 167, 172, 177, which ends with a nozzle in the vicinity of the point of incidence of the electron beam 127 on the photomask 105. In an alternative embodiment (not represented in FIG. 1), a gas feed line system is used to bring a plurality or all of the processing gases in a common stream onto the surface of the sample 105.

In the example illustrated in FIG. 1, the valves 151, 156, 161, 166, 171, 176 are arranged in the vicinity of the corresponding containers 150, 155, 160, 165, 170, 175. In an alternative arrangement, the control valves 151, 156, 161, 166, 171, 176 can be incorporated in the vicinity of the corresponding nozzles (not shown in FIG. 1). Unlike the illustration shown in FIG. 1 and without preference at the present time, it is also possible to provide one or a plurality of the gases stored in the containers 150, 155, 160, 165, 170, 175 non-directionally in the lower part of the vacuum chamber 102 of the device 100. In this case, it is necessary for the device 100 to incorporate a stop (not illustrated in FIG. 1) between the lower reaction space and the upper part of the device 100, which provides the electron beam 127, in order to prevent an excessively low vacuum in the upper part of the device 100.

Each of the supply containers 150, 155, 160, 165, 170 and 175 may have its own temperature setting element and control element that enables both cooling and heating of the corresponding supply containers. This makes it possible to store and provide the carbon-containing precursor gases, the oxidizing agent(s) and, if appropriate, the etching gas at the respectively optimum temperature (not shown in FIG. 1). Furthermore, each feeder system 152, 157, 162, 167, 172 and 177 may comprise its own temperature setting element and temperature control element in order to provide all the process gases at their optimum processing temperature at the point of incidence of the electron beam 127 on the photomask 105 (likewise not indicated in FIG. 1). The control unit 145 of the computer system 140 can control the temperature setting elements and the temperature control elements both of the supply containers 150, 155, 160, 165, 170, 175 and of the gas feed line systems 152, 157, 162, 167, 172, 177.

The device 100 in FIG. 1 comprises a pump system for generating and maintaining a vacuum required in the vacuum chamber 102 (not shown in FIG. 1). With closed control valves 151, 156, 161, 166, 171, 176, a residual gas pressure of $\leq 10^{-7}$ mbar is achieved in the vacuum chamber 102 of the device 100. The pump system may comprise separate pump systems for the upper part of the device 100 for providing the electron beam 127, and the lower part comprising the sample stage 110 with the photomask 105. Furthermore, the device 100 can comprise a suction extraction device in the vicinity of the processing point of the electron beam 127 in order to define a defined local pressure condition at the surface of the sample of the photomask 105 (not illustrated in FIG. 1). The use of an additional suction extraction device can largely prevent one or a plurality of volatile reaction products of the one or the plurality of carbon-containing precursor gases which are not needed for the local deposition of the deposited material from depositing on the photomask 105 and/or in the vacuum chamber 102. Furthermore, the suction extraction device can prevent particles that arise in an etching process from being distributed in the vacuum chamber 102 of the device 100. The functions of the pump system(s) and of the additional suction extraction device can likewise be controlled and/or monitored by the control unit 145 of the computer system 140.

Finally, the device 100 can comprise one or more scanning force microscopes that make it possible to analyze defects of the photomask in detail (not illustrated in FIG. 1).

Figure 2:
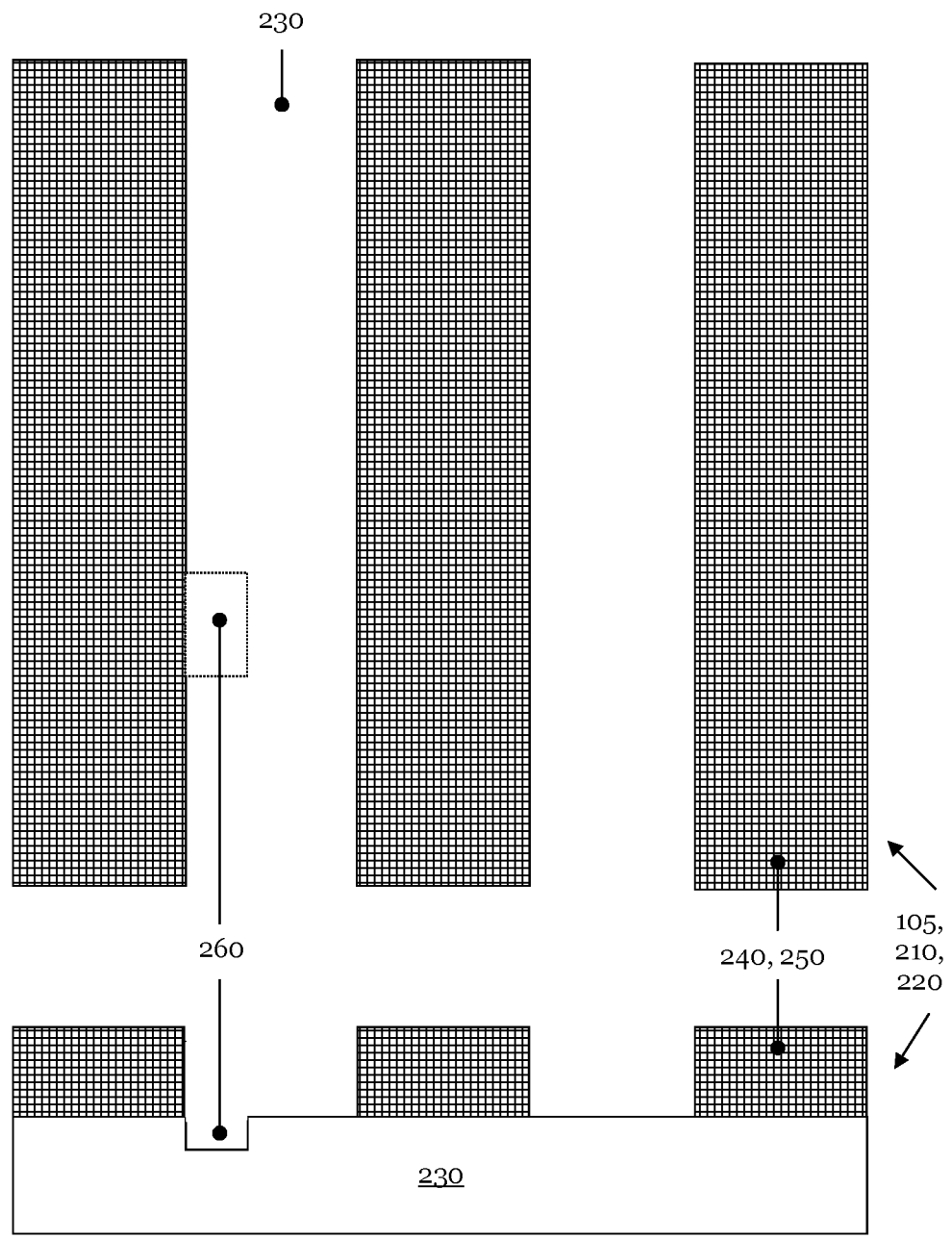
FIG. 2 schematically has an excerpt from a photomask which has a defect of absent substrate material.

FIG. 2 schematically shows an excerpt from the photomask 105. In the example in FIG. 2, the photomask 105 may comprise a binary mask 210 or a phase mask 220, for example an attenuated phase shift mask. Furthermore, the photomask 105 may comprise a pure quartz mask or a mask for nanoimprint lithography (NIL). The pure quartz mask can be exposed with radiation in the wavelength range of 193 nm.

The upper part of FIG. 2 presents a plan view of part of the mask 105. The lower part represents a side view of the excerpt in the upper part. The photolithographic mask 105 comprises an optically transparent substrate 230, preferably a quartz substrate or a calcium fluoride ($CaF_2$) substrate. If the photomask 105 represents a binary mask 210, a black or an opaque pattern 240 is arranged on the substrate 230. The pattern 240 is represented by a line pattern 240 in the example in FIG. 2. The material of the line pattern 240 often comprises chromium that is typically coated with a thin chromium oxide layer. Alternatively, it is possible to use aluminum or titanium for producing a binary photomask 210, which are likewise covered by a thin oxide layer (i.e. comprising a few nanometers). Typical absorber structures have layer thicknesses in the range of 10 nm to 100 nm.

Binary masks 210 can also be produced with other absorber materials, for example from a thick ($d \approx 200$ nm) non-transparent layer of molybdenum-silicon. Examples of further absorber materials are compounds of molybdenum, nitrogen, silicon and oxygen, which in the technical field are abbreviated to OMOG, standing for Opaque MoSi On Glass, and compounds of tantalum, boron and nitrogen. The layer thicknesses of these materials are typically in the region of 100 nm or less. A binary mask is distinguished by an absorber pattern whose structure dimensions are larger than the diffraction limit of the radiation used for the exposure and whose optical transmission at the exposure wavelength is <1%.

Absorber elements of phase masks 220, for example the line pattern 250 in FIG. 2, are often produced from partly transparent molybdenum silicon oxide ($MoSiO_x$, $0<x\leq 1$) or molybdenum silicon oxynitride ($MoSiOxNy$, $0<x\leq 1$, $0<y\leq 1$). For phase masks having exposure wavelengths in the deep ultraviolet wavelength range (248 nm or 193 nm), the elements of the structure-producing layer are often produced from silicon nitride doped with molybdenum and oxygen in the single-digit percentage range. Hereinafter these phase shifting absorber layers are designated as MoSi layers.

However, chromium oxide (CrO) and/or chromium oxynitride ($CrO_xN_y$, $0<x\leq 1$, $0<y\leq 1$) can also be used as absorber material for phase masks 220, for example attenuated phase shift masks. The layer thickness of the phase shifting and absorbing structure elements 250 of phase masks 220 is adapted to the exposure wavelength used. Examples of further phase masks are pure quartz structures of different heights, which are referred to in the technical field as CPL, standing for chromeless phase shifting lithography. Furthermore, phase masks composed of quartz structures of different heights with a binary absorber are used, which are abbreviated to APSM standing for alternating phase shift mask. The processes for defect correction as described in this application can be applied to all the mask types mentioned.

The photomask 105 in FIG. 2 has a defect 260 of absent material. The defect 260 denotes a depression in the transparent substrate 230 of the photomask 105, i.e. material of the substrate 230 is absent at the location of the defect 260. After finding the defect 260 and/or further defects 270, 280 (cf. FIGS. 5 and 7) with the aid of a corresponding metrology tool (for example with a laser system), the defect 260 or the defects 260, 270, 280 is or are scanned by the electron beam 127 of the device 100 in a first step. As necessary, the defect 260 or the defects 260, 270, 280 can additionally be examined using a scanning force microscope.

A photomask typically has a thickness of 6.35 mm. The defect 260 may have a depth of less than one nanometer up to a range of several hundred nanometers. The lateral dimensions of the defect 260 of absent substrate material may extend from the single-digit nanometers range into the two-digit micrometers range. The defect 260 can be corrected by depositing silicon dioxide ($SiO_2$) at the location of absent substrate material. The precursor gases tetraethyl orthosilicate (TEOS) and tetramethyl orthosilicate (TMOS) can be used as $SiO_2$ suppliers by cleavage of the ligands. Preferably oxygen ($O_2$), or nitrogen dioxide ($NO_2$) is used as oxidizing agent for the repair of the defect 260. In the example described below, TEOS is used as precursor gas and $NO_2$ is used as oxidizing agent.

In order to repair the clear defect 260 or the substrate defect 260, from the supply container 150 TEOS is provided at the location of the defect 260 by use of the feed line system 152 in a manner controlled by the control valve 151. Then the TEOS is adsorbed onto the surface of the substrate 230 in the region of the defect location (physisorption). With the aid of the control valve 151, the pressure at the defect location is set to $10^{-5}$ mbar. This corresponds to a gas volumetric flow rate of approximately 0.05 sccm (standard cubic centimeter). The precursor gas TEOS is provided at the location of the defect 260 at a temperature of $-10°$ C. At the same time, at the defect location, from the supply container 160 the oxidizing agent $NO_2$ is supplied via the gas feed line system 162 at a gas volumetric flow rate of 4 sccm in a manner controlled by the control valve 161. The gas volumetric flow rate of the oxygen generates a partial pressure of pressure of $10^{-3}$ mbar at the defect location. For repairing the clear defect 260, the precursor gas TEOS or more generally the main group element and the oxidizing as for example $NO_2$ may be provided with a mixture ratio of 1:10. In the example described in the context of FIGS. 2 to 4, the clear defect 260 is repaired with a gas volumetric flow rate of 4 sccm. For the defect correction described in FIGS. 6 to 8 a gas volumetric flow rate comprises a range of 0.3 sccm to 10 sccm.

An electron beam 127 of the device 100 supplies locally at the location of the defect 260 energy for initiating a local chemical reaction that cleaves at least a portion of the ligands of the precursor gas TEOS from the latter's central atom silicon. The oxidizing agent $NO_2$ additionally provided locally supports, on the one hand, the oxidation of the central atom of TEOS to $SiO_2$ and, on the other hand, the oxidation of the cleaved ligands or of the fragments thereof, which as volatile components are extracted by suction from the vacuum chamber 102 by the suction extraction device of the device 100. The oxidizing agent $NO_2$ present in excess brings about the deposition of a purer $SiO_2$ layer at the defect location, into which moreover less carbon is incorporated, compared with a process implementation without providing the oxygen at the deposition location. In the layer deposited at the defect location, carbon is represented merely with $\leq 5$ atom %.

During the deposition process, the electron beam 127 supplies electrons having a kinetic energy of up to 1 keV and having a beam current of approximately 50 pA. The electron beam is raster-scanned over the location of the defect 260 with a focus diameter of 5 nm with a repetition duration of 1 ms and a dwell time of up to 1 µs.

Figure 3:
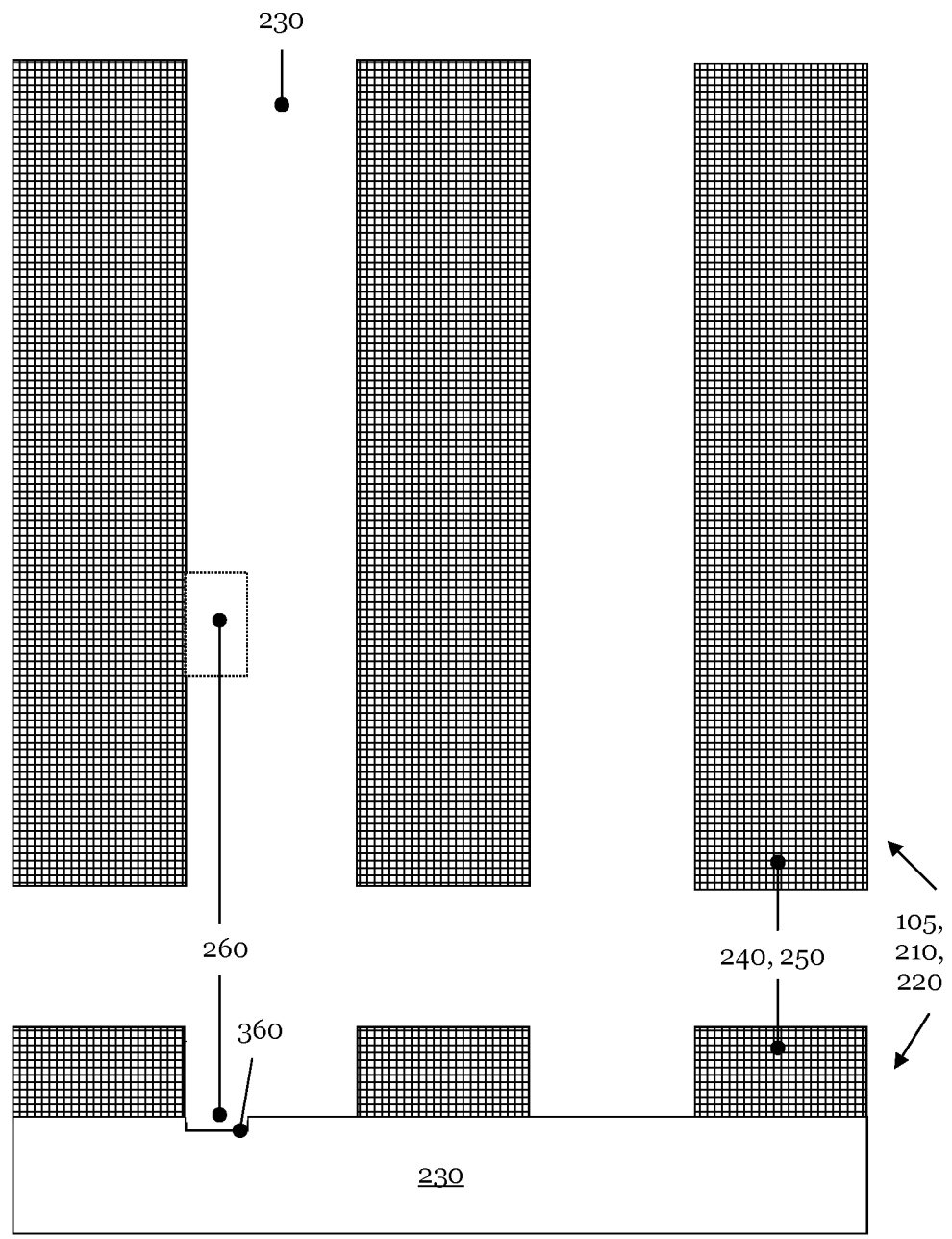
FIG. 3 reproduces the excerpt from FIG. 2 after the defect of absent substrate material has been partly repaired.

Depending on the dimensions of the defect 260, the deposition process is interrupted after a specific time duration and the remaining residue 360 of the defect 260 is analyzed by use of the electron beam 127 and/or a scanning force microscope. This is illustrated in FIG. 3. A time duration after which the deposition process has substantially repaired the defect 260 with the aid of the precursor gas TEOS and the oxidizing agent $NO_2$ is calculated from the measurement data of the residue 360 that remained.

Figure 4:
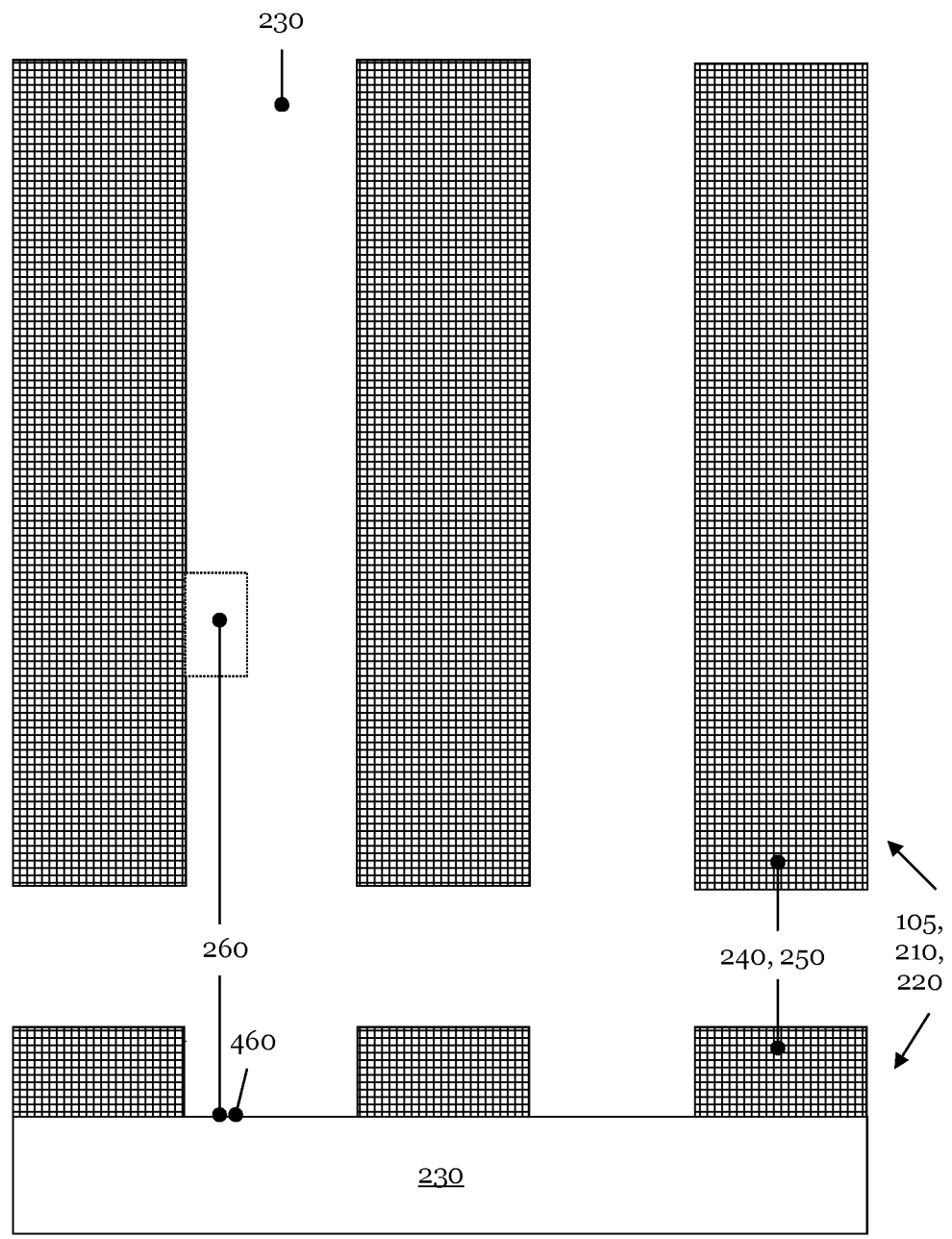
FIG. 4 represents the excerpt from FIG. 3 after the repair of the defect of absent substrate material.

FIG. 4 represents the excerpt from the photomask 105 from FIG. 3 after the end of the second deposition process step for repairing the substrate defect 260. The deposition process has substantially eliminated the depression, i.e. the defect 260, by depositing an $SiO_2$ layer. On account of the low carbon proportion of the deposited layer 460, it is expedient to choose the thickness of the deposited layer 460 such that the latter precisely fills the depression of the defect 260.

If a small proportion of the defect 260 is still present after the second deposition process step, it can be corrected by a further temporally limited deposition of $SiO_2$. If too much material has inadvertently been deposited laterally and/or vertically on the substrate 230 of the photomask 210, 220, it can be removed again after the analysis of the newly generated defect, with the aid of the electron beam 127 and an etching gas, for example xenon difluoride ($XeF_2$), stored in the supply container 175.

In the example discussed in FIGS. 2 to 4, the defect 260 is a defect of the substrate 230 of a binary mask 210 or of a phase shifting mask 220. However, the deposition process described can also be used for depositing absent material onto a phase mask that manages without structure elements composed of absorber material, such as the CPL, ASPM and NIL masks described above.

Figure 5:
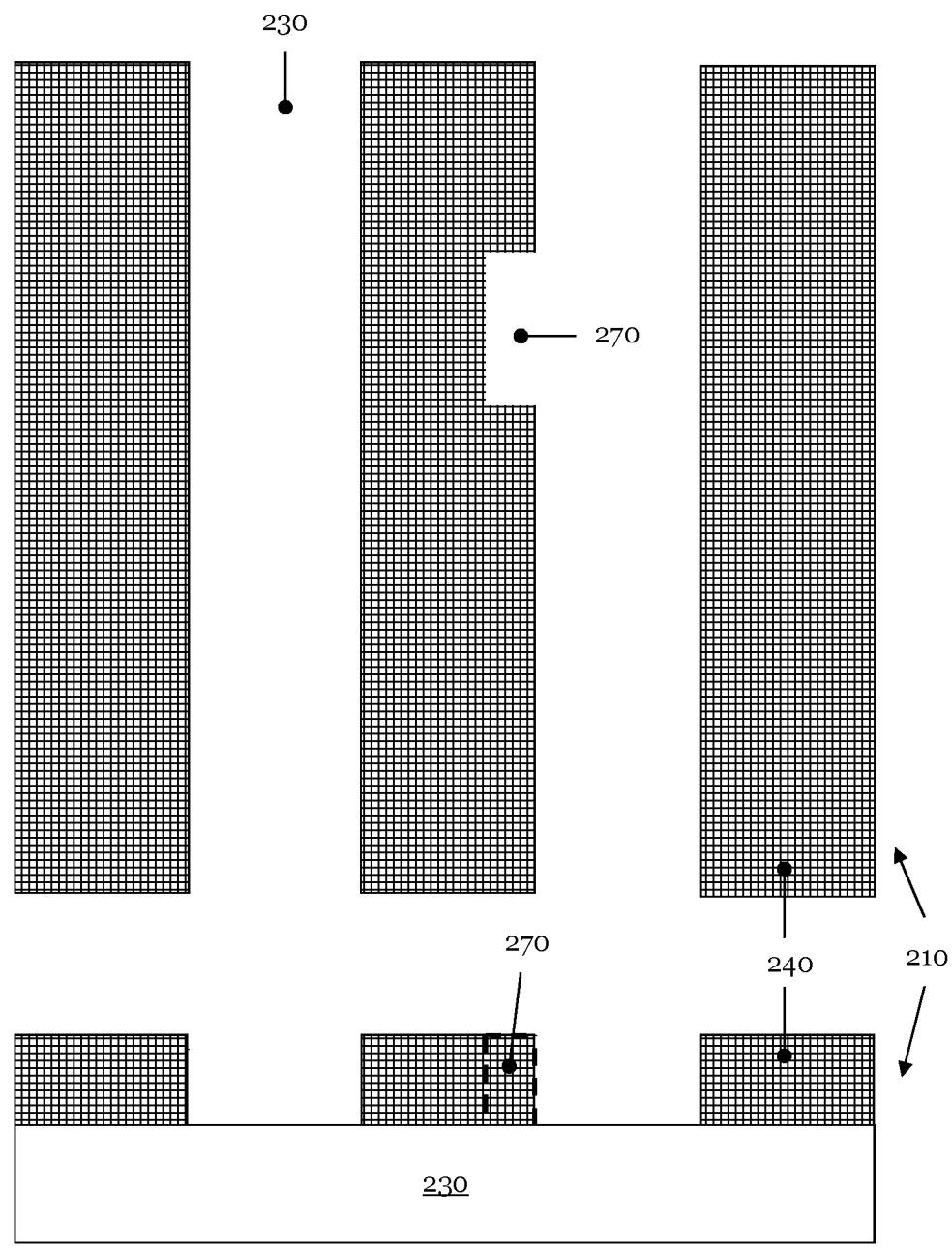
FIG. 5 schematically has an excerpt from a binary photomask which has a defect of absent absorber material.

FIG. 5 shows an excerpt from a binary phase mask 210 having absorber structure elements 240 arranged on a substrate 230. FIG. 5 presents in the upper partial illustration a plan view and in the lower partial illustration a side view of the excerpt from the binary photomask 210. In the example in FIG. 5, the absorber structure elements 240 are produced from a chromium layer comprising a thin chromium oxide layer (comprising a few nanometers) at the surface. The thickness of the chromium layer is in the range of 10 nm to 100 nm. In FIG. 5, the central absorber structure element 240 has a defect 270, which denotes a location of absent absorber material.

The repair of the defect 270 of the binary photomask 210 in FIG. 5 is discussed below. The lateral dimensions of the defect 270 may range from the single-digit nanometers range to the two-digit micrometers range. The defect 270 of the absorber structure 240 can be corrected reliably with the aid of a metal carbonyl and an oxidizing agent. In the example described here, chromium hexacarbonyl is used as precursor gas and $NO_2$ is used as oxidizing agent. Instead of chromium hexacarbonyl, another metal carbonyl can be used, as for example molybdenum hexacarbonyl ($Mo(CO)_6$), tungsten hexacarbonyl ($W(CO)_6$), dicobalt octacarbonyl ($Co_2(CO)_8$), triruthenium dodedecarbonyl ($Ru_3(CO)_{12}$) or iron pentacarbonyl ($Fe(CO)_5$). The metal carbonyl, i.e. the precursor gas and the $NO_2$ used as oxidizing agent can be provided at the defect 270 of the absorber structure 240 with a mixture ratio of 1:10.

In order to repair the defect 270 of the absorber structure element 240 of the binary mask 210, from the supply container 155 the precursor gas chromium hexacarbonyl ($Cr(CO)_6$) is supplied to the location of the defect 270 by use of the gas feed line system 157. The $Cr(CO)_6$ is adsorbed on the surface of the substrate 230 in the region of the defect 270. The control unit 145 of the computer system 140 opens the control valve 156 of the supply container 155 in order to generate a gas pressure of the $Cr(CO)_6$ at the location of the defect of $5 \cdot 10^{-4}$ mbar. This corresponds to a gas volumetric flow rate of 0.01 sccm. Simultaneously, at the defect location, from the supply container 165 the oxidizing agent $NO_2$ is provided via the gas feed line system 167 at a gas volumetric flow rate of 2 sccm in a manner controlled by the gas feed line system 167 and the control valve 166. The $NO_2$ gas volumetric flow rate generates a partial pressure of $5 \cdot 10^{-2}$ mbar at the defect location.

The electron beam 127 of the device 100 supplies locally at the location of the defect 270 energy which, in a local chemical reaction, separates at least a portion of the CO ligands of the precursor gas $Cr(CO)_6$ from the latter's central atom chromium (Cr). The oxidizing agent $NO_2$ additionally provided locally supports the dissociation of the ligands of the $Cr(CO)_6$, promotes the oxidation of the central atom Cr to CrO, in particular to $CrO_2$, and facilitates the oxidation of the dissociated CO ligands to carbon dioxide ($CO_2$), which as volatile components can be extracted by suction from the vacuum chamber 102 by the suction extraction device of the device 100. In comparison with a deposition process without additionally providing $NO_2$ at the location of the defect 270, the $NO_2$ excess leads to the deposition of a purer Cr/CrO layer at the defect location. Since the overwhelming majority of the cleaved CO ligands can be removed as $CO_2$ from the vacuum chamber 102 of the device 100, drastically less carbon is incorporated into the deposited layer. The deposited layer comprises only about 5 atom % of carbon.

In order to initiate the deposition process, the electron beam 127 provides electrons having a kinetic energy of 1 keV and having a current intensity of approximately 40 pA. The electron beam 127 is raster-scanned over the location of the defect 270 with a focus diameter of 5 nm with a repetition time of 1 ms and a dwell time of 1 μs.

Figure 6:
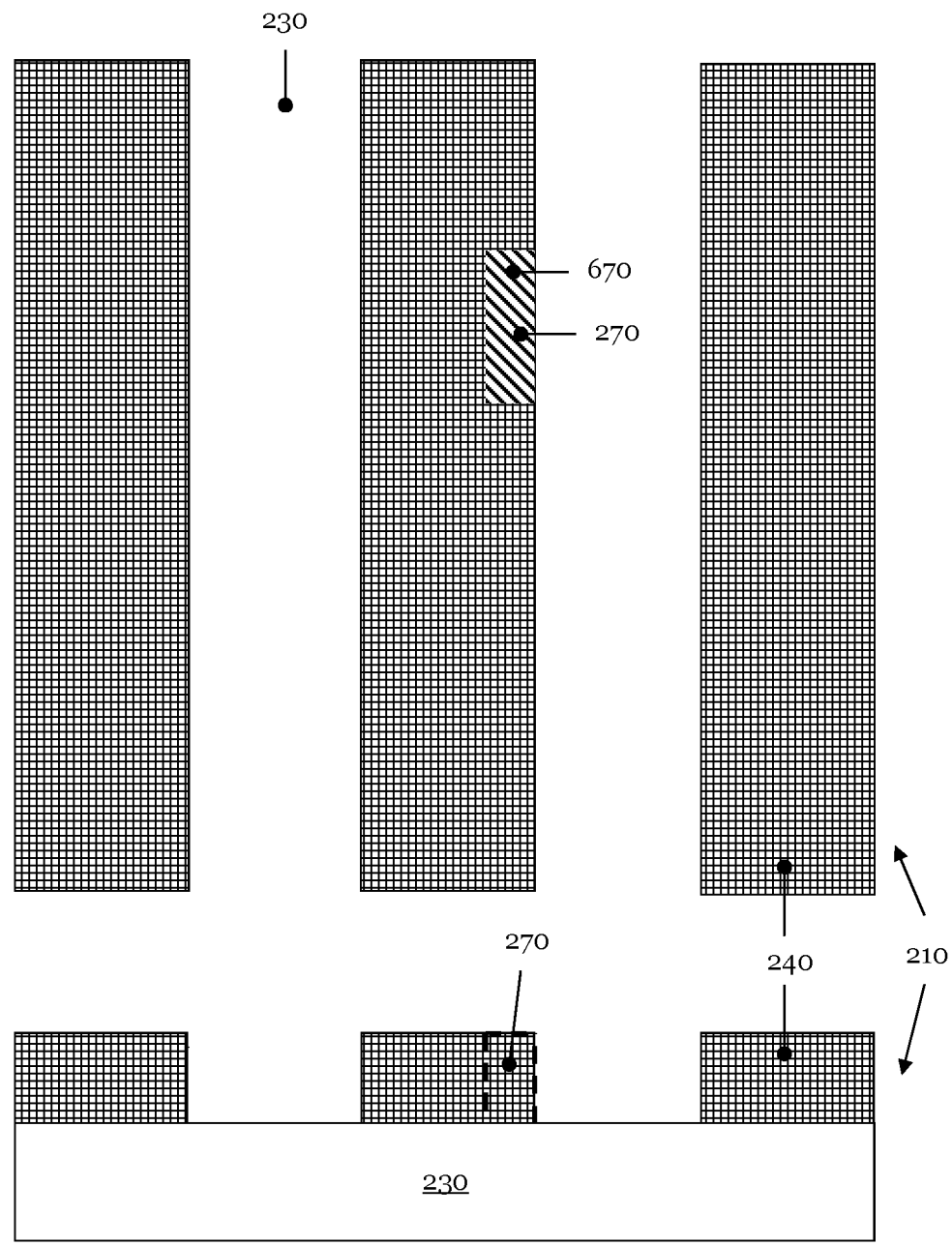
FIG. 6 illustrates FIG. 5 with the repaired defect.

The repair process can be performed—as explained above—once again in a plurality of successive steps. Between the individual deposition steps, the residue of the defect 270 that still remained is analyzed by use of the electron beam 127 and/or a scanning force microscope and the time duration for the next deposition step is thereby determined. FIG. 6 shows the layer 670 deposited at the location of the defect 270. The height of the deposited material 670 is adapted to the height of the absorber elements 240. This is advantageous owing to the similar optical properties of the absorber structure elements 240 and of the material of the deposited layer 670.

Between the individual repair steps, the partial pressure ratio of the metal carbonyl $Cr(CO)_6$ and of the oxidizing agent $NO_2$ can be adapted. It is furthermore possible to provide the precursor gas and/or the oxidizing agent continuously or in a pulsed manner at the location of the defect 270 during the deposition process.

Each electron supplied by the electron beam 127 leads to the deposition of a volume of 0.05 Å$^3$ to 0.25 Å$^3$. This corresponds to a deposition rate of approximately 0.1 nm/s.

As already mentioned above, the layer thickness of the absorber elements 240 is in the range of 10 nm to 100 nm. A Cr/CrO layer having a thickness of 60 nm can thus be deposited in a time interval of approximately 10 minutes.

The examples discussed in the context of FIGS. 2 to 6 relate to the repair of absent material of binary 210 or phase shifting transmissive photomasks 220. However, the repair process described can also be used for repairing absent material of absorber elements of photomasks for the extreme ultraviolet (EUV) wavelength range. In the case of EUV masks, absorber structure elements are often produced from chromium or tantalum nitride (TaN). By choosing a corresponding metal carbonyl and an oxidizing agent, for instance oxygen or nitrogen dioxide, it is possible to repair defects of absent absorber material in EUV masks. Chromium layers can be repaired—as already explained above—for example by the use of the precursor gas chromium hexacarbonyl ($Cr(CO)_6$) and tantalum nitride layers can be repaired for example with the aid of the precursor gas tantalum hexacarbonyl ($Ta(CO)_6$). Alternatively, titanium tetraisoproproxide ($Ti(OCH(CH_3)_2)_4$) can be used for repairing clear defects of TaN absorber structure elements.

Figure 7:
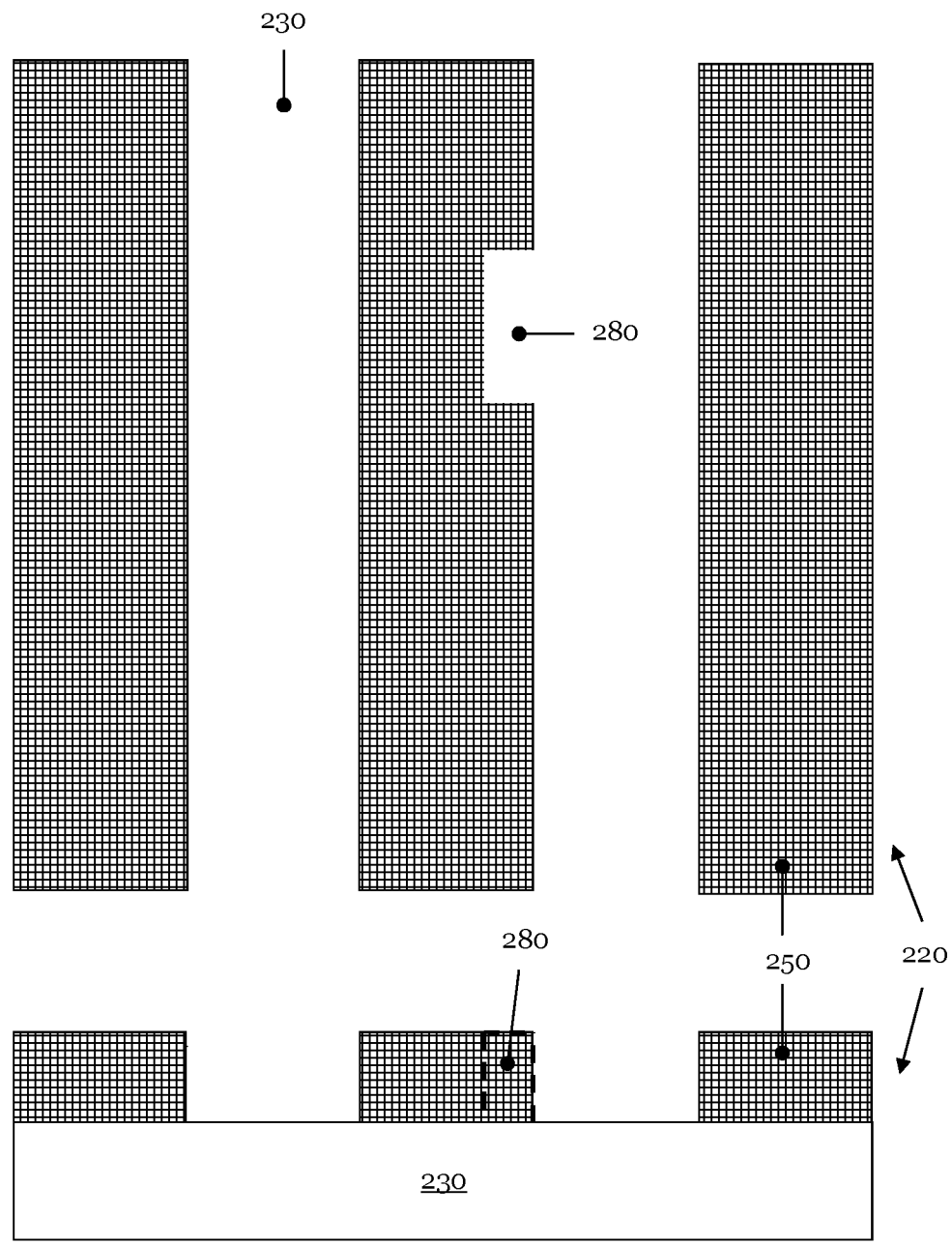
FIG. 7 schematically represents an excerpt from a phase shifting photomask and/or a pure quartz mask which has a defect of absent absorber material.

In a further application example, the photomask 220 in FIG. 7 describes a phase shifting mask whose absorber elements 250 comprise a thin partly transmissive MoSi layer (attenuated phase shift mask). In the example in FIG. 7, the MoSi layer of an absorber element 250 has the defect 280 of absent absorber material. The defect 280 of the MoSi absorber element 250 can be corrected by simultaneously depositing silicon dioxide ($SiO_2$) and a metal at the location of absent absorber material. In this case, TEOS and/or TMOS can be used as precursor gases supplying $SiO_2$, and a metal carbonyl can be used as a precursor gas supplying metal. Once again use is preferably made of $O_2$ and/or $NO_2$ as oxidizing agent for the repair of the defect 280 of the MoSi absorber element 250.

In order to correct the defect 280 of absent absorber material, from the supply container 150 TEOS is provided at the location of the defect 280 by use of the feed line system 152 in a manner controlled by the control valve 151. With the aid of the control valve 151, the pressure at the defect location is set to $10^{-5}$ mbar. The precursor gas TEOS is at a temperature of $-10°$ C. at the location of the defect 280. At the same time, at the defect location, from the supply container 155 chromium hexacarbonyl is brought to the location of the defect 280 in a manner controlled by the control valve 156 and the gas feed line system 157. At the location of the defect 280, the $Cr(CO)_6$ is at a temperature of $-20°$ C. The control valve 156 is opened to an extent such that the partial pressure of the precursor gas $Cr(CO)_6$ reaches $5 \cdot 10^{-6}$ mbar. In the example under discussion, the precursor gases have a partial pressure ratio TEOS:$Cr(CO)_6$ of 5:1. The two precursor gases coadsorb in the region of the defect 280 on the surface of the substrate 230 of the phase shifting photomask 220. The defect 280 may be corrected by providing one or more metal carbonyl in a temperature range of $-50°$ C. to $+35°$ C. The main group element alkoxide (TEOS for correcting the defect 280) is provided at the defect location having a temperature in the range of $-40°$ C. to $+15°$ C.

In parallel with the precursor gases TEOS and $Cr(CO)_6$, from the supply container 165 the oxidizing agent $NO_2$ is passed to the location of the defect 280 via the gas feed line system 167 at a gas volumetric flow rate of 2.5 sccm in a manner controlled by the control valve 166. The gas volumetric flow rate of the $NO_2$ generates a partial pressure of $10^{-2}$ mbar at the defect location. Generally, for correcting the defect 280, one or more metal carbonyl is provided in a pressure range of $10^{-6}$ mbar to $10^{-4}$ mbar. Further, one or more main group element alkoxides is provide at the location of the defect 280 in a pressure range of $10^{-6}$ mbar to $10^{-4}$ mbar. Moreover, the local chemical defect correction reaction is carried out by providing at least one of the oxidizing agents in a pressure range of $10^{-5}$ mbar to $10^{-2}$ mbar.

An electron beam 127 of the device 100 initiates locally at the location of the defect 280 a chemical reaction that cleaves at least a portion of the ligands of the precursor gas TEOS from the latter's central atom silicon. Furthermore, the local chemical reaction simultaneously brings about a dissociation of the CO ligands from the central atom chromium of the chromium hexacarbonyl. The $NO_2$ additionally provided locally fosters the oxidation of the silicon central atom of TEOS to $SiO_2$, the oxidation of the chromium central atom of $Cr(CO)_6$ and the oxidation of the cleaved ligands or of fragments of the ligands. In particular, the nitrogen dioxide present in excess promotes the oxidation of the CO ligands to volatile $CO_2$. The volatile components that arose during the decomposition of the precursor gases are removed from the vacuum chamber 102 by the suction extraction device of the device 100.

In order to initiate the local chemical reaction, the electron beam 127 is scanned over the location of the defect 270 with a focus diameter of 5 nm with a repetition time of 1 ms and a dwell time of 1 µs. The electrons of the electron beam 127 impinge on the surface of the substrate 230 of the photomask 220 with a kinetic energy of 1 keV at the defect location. The current intensity of the electron beam 127 is in the region of approximately 50 pA.

Figure 8:
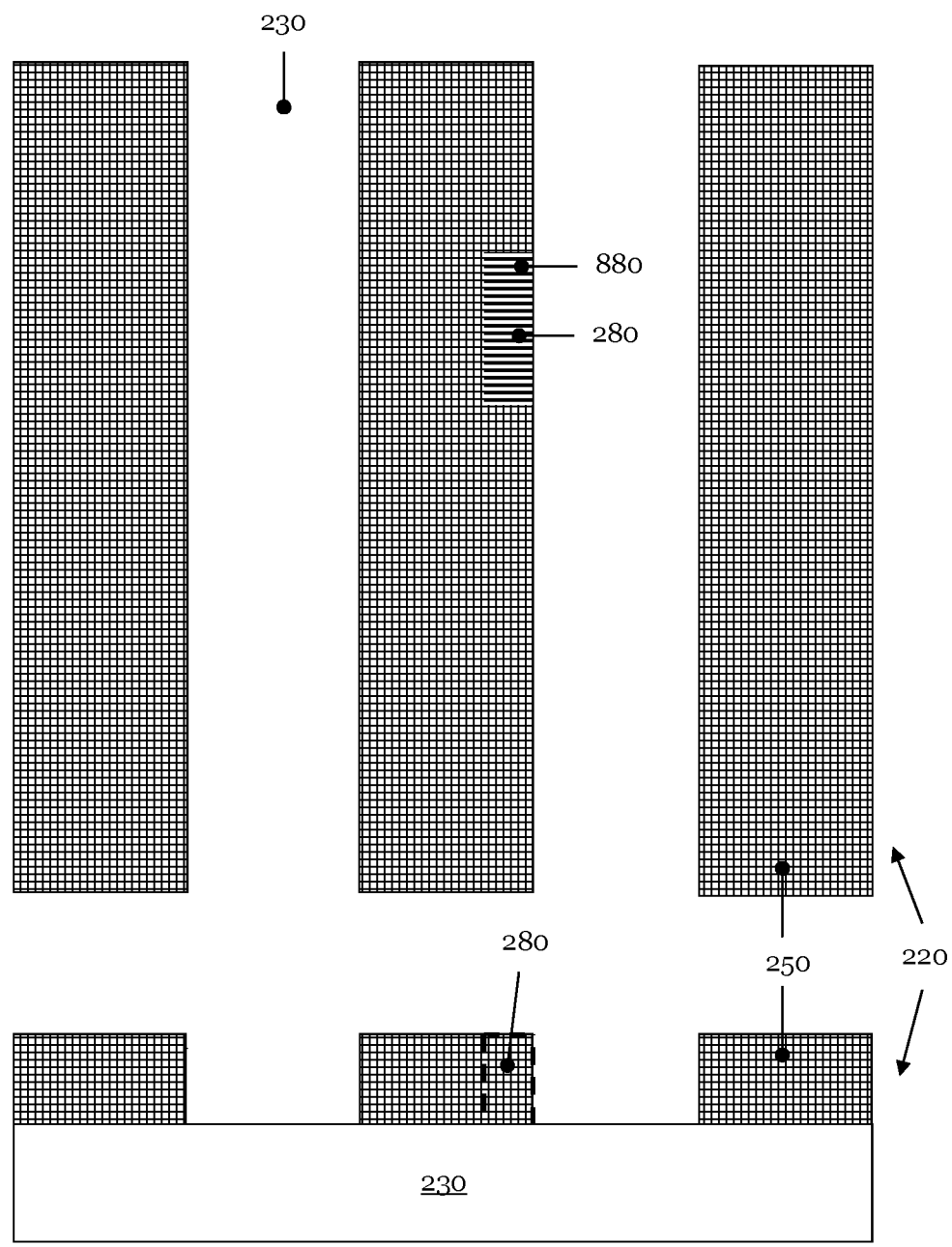
FIG. 8 shows FIG. 7 with the corrected defect.

FIG. 8 shows the excerpt from the phase mask 220 from FIG. 7 after the repair of the defect 280. The layer 870 was deposited at the location of said defect. The height of the deposited layer 870 substantially corresponds to the thickness of the MoSi structure elements 250.

The oxidation of the precursor gases during the deposition process leads to a reduction of the carbon proportion in the deposited material compared with the carbon proportion of the precursor gases used. As a result, the oxidizing agent $NO_2$ in combination with the precursor gases TEOS and $Cr(CO)_6$ brings about the deposition of a carbon-poor $SiO_2$/Cr layer at the location of the defect 280. The carbon proportion of the layer deposited at the defect location is ≤5 atom %.

The temporal sequence of the deposition process is described above in the context of the discussion of FIGS. 2 to 4.

The repair of an MoSi structure element 250 of a phase mask 220 is explained in FIGS. 7 and 8. As already indicated above, the absorber structure elements 240 of a binary photomask 210 can likewise be produced from a thick non-transparent MoSi layer. The process for repairing a partly transmissive thin MoSi layer as explained in the context of FIGS. 7 and 8 can, of course, also be used for correcting a defect of absent material of a thick non-transmissive MoSi layer.

In the prior art, the defects 280 of phase shifting MoSi layers 250 are deposited by the progressive application of an $SiO_2$ layer from TEOS and a chromium layer from $Cr(CO)_6$. According to the theory, the phase shifting effect is ascribed principally to the layer deposited from the precursor gas TEOS and the absorbing effect is ascribed predominantly to the layer deposited from the precursor gas $Cr(CO)_6$. Typically, in the prior art in order to repair defects 280 of MoSi layers, deposited materials having a layer thickness significantly greater than the surrounding MoSi layer are deposited. Therefore, in the case of photomasks 220 having feature sizes of <150 nm, in the region of the repaired location, deviations in the exposure of a wafer can occur compared with a defect-free reference location.

The intermixing of the two precursor gases at the reaction location, i.e. at the location of the defect 280, with simultaneous oxidation by the oxidizing agent utilizes the phase shifting and the absorbing properties of all the reactants. A separation into a phase shifting layer and an absorbing layer is cancelled as a result. Moreover, the oxidation of both precursor gases results in a deposited material at the repaired location which has a very low carbon proportion. For this reason, the repaired location of the MoSi absorber structure element 250 is not subject to significant ageing and in particular exhibits long-term stability in relation to mask cleaning processes and also the exposure doses which occur during the use of the repaired photomask 210, 220. The process—described in the prior art—of applying a metallic protective layer above the repaired location of the absorber element 250 of the phase mask 220 can be omitted. As a result, the method described in this application significantly simplifies the repair of absent material.

If the exemplary repair processes described above in the context of the discussion of FIGS. 2 to 8 are performed without providing an oxidizing agent, then the deposited layers have a carbon proportion of 20 atom % or more. During exposure with high-energy deep ultraviolet light ($\lambda$=193 nm), photomasks are subjected to an enormous loading. The radiation dose during the exposure of a wafer is very much greater than 100 kJ/cm$^2$. As a result of the extremely high exposure doses, in the extremely clean and dry environment of photolithographic exposure apparatuses (XCDA (eXtra Clean Dry Air) atmosphere), the formation of ozone can occur, ozone being known as a particularly good oxidizing agent for carbon or carbon compounds. The carbon incorporated into the deposited layers at the locations of the repaired defects 260, 270, 280, or the incorporated carbon compounds, such as CO ligands, for example, react with the ozone to form $CO_2$, which escapes from the deposited material and thus weakens the structure thereof.

Furthermore, modern cleaning agents for photomasks 210, 220 are particularly effective on carbon-containing compounds. As a result, in the context of the mask cleaning that regularly takes place, carbon or carbon-containing constituents is/are extracted from the layers deposited for defect correction. This leads firstly to a change in the optical properties of the deposited materials and secondly to a weakening of the structure thereof. In total, therefore, materials deposited on a photomask 210, 220 are subject to ageing if they are deposited without additional oxidizing agent.

Figure 9:
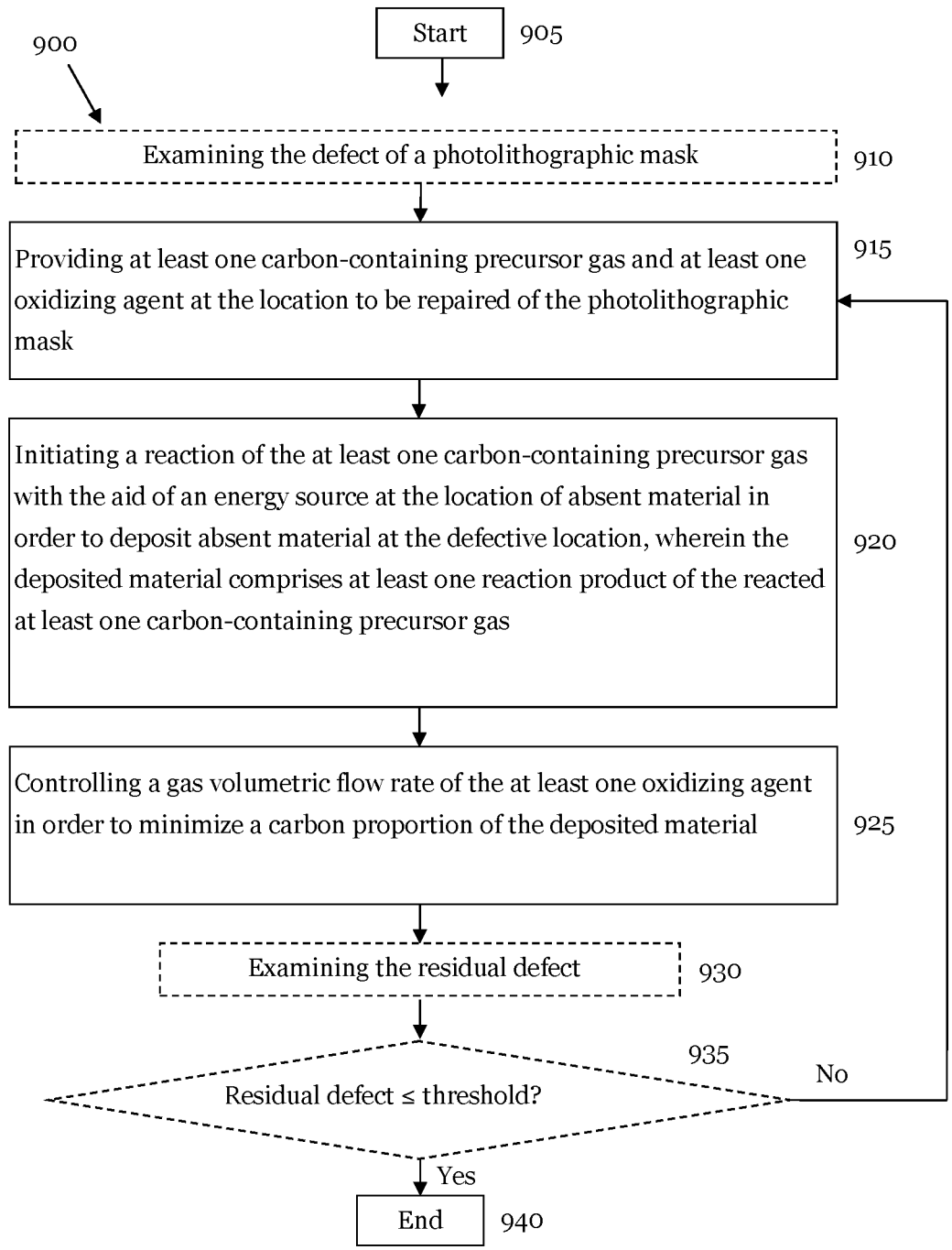
FIG. 9 reproduces a flow diagram of the method for repairing defects of absent material of a photolithographic mask.

The flow diagram 900 in FIG. 9 represents steps of the method for permanently repairing defects 260, 270, 280 of absent material of a photolithographic mask 105, 210, 220. The optional method steps are represented by a dashed frame in the diagram 900.

The method starts at step 905. Step 910 involves examining the defect 260, 270, 280 or the identified defects 260, 270, 280 of absent material with the aid of an electron beam 127 and/or a probe of a scanning force microscope. Step 915 involves providing at least one carbon-containing precursor gas and at least one oxidizing agent at the defective location 260, 270, 280 of the photolithographic mask 105, 210, 220.

In step 920, an energy source, for example the electron beam 127, initiates a local chemical reaction of the at least one carbon-containing precursor gas at the location of absent material in order to deposit absent material at the defective location 260, 270, 280, wherein the deposited material 460, 670, 880 comprises at least one reaction product of the reacted at least one carbon-comprising precursor gas.

Step 925 comprises controlling a gas volumetric flow rate of the at least one oxidizing agent in order to minimize a carbon proportion of the deposited material 460, 670, 880. The gas volumetric flow rate of the oxidizing agent can be implemented by a control unit 145 in conjunction with control valves 151, 156, 161, 166, 171, 176.

Step 930 involves examining the residual defect 360. Decision step 935 then involves deciding whether the residual defect 360 is less than or equal to a predefined threshold value. If this is the case, the method ends at step 940. If this is not the case, the method proceeds to step 915 and starts a second deposition process step.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results.

Thus, particular embodiments of the subject matter have been described. Other embodiments are within the scope of the following claims. In some cases, the actions recited in the claims can be performed in a different order and still achieve desirable results.

What is claimed is:

1. A method for repairing defects of absent material of a photolithographic mask, wherein the method comprises the following steps:
   a. providing at least one carbon-containing precursor gas and at least one oxidizing agent at a location to be repaired of the photolithographic mask, in which the at least one carbon-containing precursor gas comprises a mixture of at least one metal carbonyl and at least one main group element alkoxide at the location to be repaired;
   b. initiating a reaction of the at least one carbon-containing precursor gas with the aid of at least one energy source at the location of absent material in order to deposit material at the location of absent material, wherein the deposited material comprises at least one reaction product of the reacted mixture of the at least one metal carbonyl and the at least one main group element alkoxide, and controlling a gas volumetric flow rate of the mixture of the at least one metal carbonyl and the at least one main group element alkoxide to cause the material to be deposited at a rate of 0.01 nm/s to 1.0 nm/s; and
   c. controlling the gas volumetric flow rate of the at least one oxidizing agent in order to reduce a carbon proportion of the deposited material, wherein the deposited material comprises a carbon proportion of <20 atom %;
   d. wherein the deposited material withstands a radiation dose during an exposure of more than 100 kJ/cm² and at least 10 cleaning cycles without a change in its optical properties and its dimensions.

2. The method according to claim 1, wherein the deposited material comprises a carbon proportion of <15 atom %.

3. The method according to claim 1, wherein the at least one metal carbonyl comprises at least one element from the group: chromium hexacarbonyl ($Cr(CO)_6$), molybdenum hexacarbonyl ($Mo(CO)_6$), tungsten hexacarbonyl ($W(CO)_6$), dicobalt octacarbonyl ($Co_2(CO)_8$), triruthenium dodecacarbonyl ($Ru_3(CO)_{12}$), and iron pentacarbonyl ($Fe(CO)_5$).

4. The method according to claim 1, wherein the at least one main group element alkoxide comprises at least one element from the group: tetraethyl orthosilicate ($Si(OC_2H_5)_4$), tetramethyl orthosilicate ($Si(OCH_3)_4$) and titanium tetraisopropoxide ($Ti(OCH(CH_3)_2)_4$).

5. The method of claim 4 in which the deposited material comprises metal atoms and Si, and wherein step b. comprises controlling the gas volumetric flow rate of the mixture of the at least one metal carbonyl and the at least one main group element alkoxide to cause the material comprising metal atoms and Si to be deposited at a rate of 0.01 nm/s to 1.0 nm/s.

6. The method of claim 4 in which the deposited material comprises metal atoms and Ti, and wherein step b. comprises controlling the gas volumetric flow rate of the mixture of the at least one metal carbonyl and the at least one main group element alkoxide to cause the material comprising metal atoms and Ti to be deposited at a rate of 0.01 nm/s to 1.0 nm/s.

7. The method according to claim 1, wherein the at least one oxidizing agent comprises at least one element from the group: oxygen ($O_2$), ozone ($O_3$), water vapor ($H_2O$), hydrogen peroxide ($H_2O_2$), dinitrogen monoxide ($N_2O$), nitrogen monoxide (NO), nitrogen dioxide ($NO_2$) and nitric acid ($HNO_3$).

8. The method according to claim 1, wherein the at least one energy source comprises at least one particle beam.

9. The method according to claim 1, wherein the absent material comprises at least one element from the group: absent material of at least one structure element of a binary mask, absent material of at least one structure element of a phase mask, absent material of at least one structure element of a photomask for the extreme ultraviolet wavelength range, absent material of a substrate of a transmissive photolithographic mask, and absent material of at least one structure element of a nanoimprint lithography mask.

10. The method according to claim 1, wherein providing the at least one precursor gas and the at least one oxidizing agent at the location of absent material is carried out with a mixture ratio of 1:10.

11. The method according to claim 1, wherein providing the at least one metal carbonyl and the at least one main group element alkoxide is carried out with a mixture ratio of 1:5.

12. The method according to claim 1, wherein providing the at least one main group element alkoxide and the at least one oxidizing agent at the location of absent material is carried out with a mixture ratio of 1:10.

13. The method according to claim 1, wherein providing the at least one oxidizing agent is carried out with a gas volumetric flow rate in the range of 0.3 sccm to 10 sccm.

14. The method according to claim 1, wherein providing the at least one metal carbonyl at the location of absent material is carried out in a pressure range of $10^{-6}$ mbar to $10^{-4}$ mbar, providing the at least one main group element alkoxide is carried out in a pressure range of $10^{-6}$ mbar to $10^{-4}$ mbar, and/or providing the at least one oxidizing agent is carried out in a pressure range of $10^{-5}$ mbar to $10^{-2}$ mbar.

15. The method according to claim 1, wherein providing the at least one metal carbonyl at the location of absent material is carried out in a temperature range of −50° C. to +35° C.

16. The method according to claim 1, wherein providing the at least one main group element alkoxide at the location of absent material is carried out in a temperature range of −40° C. to +15° C.

17. The method according to claim 1, wherein the photolithographic mask comprises a phase mask, and providing the at least one precursor gas comprises simultaneously providing chromium hexacarbonyl ($Cr(CO_6)$) and tetraethyl orthosilicate ($Si(OC_2H_5)_4$).

18. The method of claim 1 in which the at least one energy source comprises an electron beam that has a resolution in a range of 0.4 nm to 10 nm.

19. A method for repairing defects of absent material of a photolithographic mask, the method comprising:
   a. providing a mixture of at least one metal carbonyl, at least one main group element alkoxide, and at least one oxidizing agent at a location to be repaired of the photolithographic mask; and
   b. initiating a reaction of the at least one metal carbonyl and the at least one main group element alkoxide with the aid of at least one energy source at the location of absent material in order to deposit material at the location of absent material, wherein the deposited material comprises at least one reaction product of the reacted mixture of the at least one metal carbonyl and the at least one main group element alkoxide, and controlling a gas volumetric flow rate of the mixture of the at least one metal carbonyl, the at least one main group element alkoxide, and the at least one oxidizing agent to cause the material to be deposited at a rate of 0.01 nm/s to 1.0 nm/s;
   c. wherein the deposited material is configured to withstand a radiation dose during an exposure of more than 100 kJ/cm$^2$ and at least 10 cleaning cycles without a change in its optical properties and its dimensions.

20. The method of claim 19, comprising controlling the gas volumetric flow rate of the at least one oxidizing agent in order to reduce a carbon proportion of the deposited material to be less than 15 atom %.

21. The method of claim 19 in which the at least one energy source comprises an electron beam that has a resolution in a range of 0.4 nm to 10 nm.

22. The method of claim 19 in which the at least one main group element alkoxide comprises at least one element from the group: tetraethyl orthosilicate ($Si(OC_2H_5)_4$), tetramethyl orthosilicate ($Si(OCH_3)_4$) and titanium tetraisopropoxide ($Ti(OCH(CH_3)_2)_4$).

23. The method of claim 22 in which the deposited material comprises metal atoms and Si, and wherein step b. comprises controlling the gas volumetric flow rate of the mixture of the at least one metal carbonyl and the at least one main group element alkoxide to cause the material comprising metal atoms and Si to be deposited at a rate of 0.01 nm/s to 1.0 nm/s.

24. The method of claim 22 in which the deposited material comprises metal atoms and Ti, and wherein step b. comprises controlling the gas volumetric flow rate of the mixture of the at least one metal carbonyl and the at least one main group element alkoxide to cause the material comprising metal atoms and Ti to be deposited at a rate of 0.01 nm/s to 1.0 nm/s.

* * * * *

UNITED STATES PATENT AND TRADEMARK OFFICE
CERTIFICATE OF CORRECTION

PATENT NO. : 10,732,501 B2
APPLICATION NO. : 16/452632
DATED : August 4, 2020
INVENTOR(S) : Jens Oster et al.

Page 1 of 1

It is certified that error appears in the above-identified patent and that said Letters Patent is hereby corrected as shown below:

On the Title Page

Page 2
Column 2 (item (56), Other Publications), Line 2, delete "nanometer-scal" and insert
-- nanometer-scale --

In the Specification

Column 4
Line 30, delete "1 us" and insert -- 1 μs --
Line 31, delete "50 us" and insert -- 50 μs --
Line 31, delete "100 us" and insert -- 100 μs --

Column 12
Line 42, delete "ASPM" and insert -- APSM --
Line 67, delete "dodedecarbonyl" and insert -- dodecacarbonyl --

Column 14
Line 21, delete "tetraisoproproxide" and insert -- tetraisopropoxide --

Signed and Sealed this
Twentieth Day of October, 2020

Andrei Iancu
*Director of the United States Patent and Trademark Office*